(12) United States Patent
Yu et al.

(10) Patent No.: US 9,645,306 B2
(45) Date of Patent: May 9, 2017

(54) BACKLIGHT MODULE, LCD AND OLED DISPLAY DEVICE

(71) Applicant: Shenzhen China Star Optoelectronics Technology Co., Ltd., Shenzhen, Guangdong (CN)

(72) Inventors: Yajun Yu, Guangdong (CN); Chengling Lv, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 14/369,683

(22) PCT Filed: Jun. 13, 2014

(86) PCT No.: PCT/CN2014/079840
§ 371 (c)(1),
(2) Date: Jun. 28, 2014

(87) PCT Pub. No.: WO2015/188371
PCT Pub. Date: Dec. 17, 2015

(65) Prior Publication Data
US 2016/0299283 A1    Oct. 13, 2016

(30) Foreign Application Priority Data
Jun. 10, 2014  (CN) .......................... 2014 1 0256488

(51) Int. Cl.
*G02F 1/1333*      (2006.01)
*F21V 8/00*        (2006.01)
(Continued)

(52) U.S. Cl.
CPC ...... *G02B 6/0088* (2013.01); *G02F 1/133608* (2013.01); *G02F 1/133611* (2013.01); *H01L 51/529* (2013.01); *H01L 51/5237* (2013.01); *G02F 2001/133314* (2013.01); *G02F 2001/133612* (2013.01); *H01L 2251/5338* (2013.01)

(58) Field of Classification Search
CPC ... G02F 2001/133314; G02F 1/133608; G02F 1/133611; G02F 2001/133612
See application file for complete search history.

(56) References Cited

U.S. PATENT DOCUMENTS

2011/0285933 A1* 11/2011 Cho ................... B21D 22/02
349/58

FOREIGN PATENT DOCUMENTS

CN            103366641 A      10/2013

* cited by examiner

*Primary Examiner* — Phu Vu
(74) *Attorney, Agent, or Firm* — Andrew C. Cheng

(57) ABSTRACT

The present invention proposes a backlight module including a back bezel made of memorizing alloy materials and a heating apparatus for heating the back bezel. The back bezel is curved upon a condition that a temperature is equal or over a predetermined temperature. The back bezel is flattened upon a condition that the temperature is under the predetermined temperature. The predetermined temperature indicates to a threshold temperature of deformation of the memorizing alloy materials. The present invention also proposes an LCD device and an OLED display device. The backlight module, the LCD device and the OLED display device of the present invention are capable of switching a surface between a plane and a curve at will.

9 Claims, 2 Drawing Sheets

(51) Int. Cl.
*G02F 1/1335* (2006.01)
*H01L 51/52* (2006.01)

BACKLIGHT MODULE, LCD AND OLED DISPLAY DEVICE

BACKGROUND OF THE INVENTION

1. Field of the Invention

The present invention relates to a display technology field, more particularly, to a backlight module, a liquid crystal display (LCD) device and an organic light emitting diode (OLED) display device.

2. Description of the Prior Art

With larger size of flat television (TV), the distance between the edge of the screen and viewers is larger than that between the center of the screen and the viewers so that it leads to image deformation and color distortion for the edge of the screen. An important object to curve the screen is that a curved TV provides a better viewing effect than a traditional flat TV does. For instance, the reason that viewers from any seats in an Image Maximum (IMAX) theater have similar experience from the central seats results from the curved screen. A principle of a curved screen of a curved TV is identical to that in an IMAX theater, which is keeping the distance between every point of a screen and a viewer the same through elaborately curved angles by a whole TV screen in a curved design surrounding viewers. Therefore, it not only reduces the off-axis viewing distortion but also provides broader viewing angles and the panoramic image effect so that viewers in the living room enjoys similar viewing experience with IMAX.

FIG. 1 illustrates a structure diagram of a conventional curved LCD device. As FIG. 1 shows, the curved LCD device in the prior art comprises a curved backlight module 110 and a curved open cell 120 opposite to the backlight module 110. The curved backlight module 110 is fixed to the curved open cell 120 by fixed assembly between a frame 130 and a housing 111. Owing to difficulty of producing large curved sheet metal parts, it generally fabricates a curved steel bracket 113 first and locks the steel bracket 113 to the flat back bezel 112 via a locking attachment 114 to forcedly bend the back bezel 112 to form the curved backlight module 110. In hence, the backlight module 110 made in such way forms in a constant curvature, not switching a surface between a plane and a curve.

SUMMARY OF THE INVENTION

According to the present invention, a backlight module comprises a back bezel made of memorizing alloy materials and a heating apparatus for heating the back bezel. The back bezel is curved upon a condition that a temperature is equal or over a predetermined temperature. The back bezel is flattened upon a condition that the temperature is under the predetermined temperature. The predetermined temperature indicates to a threshold temperature of deformation of the memorizing alloy materials.

In one aspect of the present invention, the heating apparatus is a heating sheet, fixed onto a lower or upper surface of the back bezel, for heating the back bezel.

In another aspect of the present invention, the heating apparatus is an electrode, fixed onto the lower or upper surface of the back bezel, for conducting to heat up the back bezel.

In yet another aspect of the present invention, the backlight module further comprises an insulating plate fixed onto the lower surface of the back bezel.

According to the present invention, a liquid crystal display device includes a backlight module and a liquid crystal panel over the backlight module. The backlight module comprises a back bezel made of memorizing alloy materials and a heating apparatus for heating the back bezel. The back bezel is curved upon a condition that a temperature is equal or over a predetermined temperature. The back bezel is flattened upon a condition that the temperature is under the predetermined temperature. The predetermined temperature indicates to a threshold temperature of deformation of the memorizing alloy materials.

In one aspect of the present invention, the heating apparatus is a heating sheet, fixed onto a lower or upper surface of the back bezel, for heating the back bezel.

In another aspect of the present invention, the heating apparatus is an electrode, fixed onto the lower or upper surface of the back bezel, for conducting to heat up the back bezel.

In yet another aspect of the present invention, the liquid crystal display device further comprises an insulating plate fixed onto the lower surface of the back bezel.

According to the present invention, an organic light emitting diode (OLED) display device comprises a back bezel made of memorizing alloy materials, an OLED panel over the back bezel, and a heating apparatus for heating the back bezel, wherein a back bezel. The back bezel is curved upon a condition that a temperature is equal or over a predetermined temperature. The back bezel is flattened upon a condition that the temperature is under the predetermined temperature. The predetermined temperature indicates to a threshold temperature of deformation of the memorizing alloy materials.

In one aspect of the present invention, the heating apparatus is a heating sheet, fixed onto a lower or upper surface of the back bezel, for heating the back bezel.

In another aspect of the present invention, the heating apparatus is an electrode, fixed onto the lower or upper surface of the back bezel, for conducting to heat up the back bezel.

In yet another aspect of the present invention, the OLED display device further comprises an insulating plate fixed onto the lower surface of the back bezel.

An object of the backlight module, the LCD device and the OLED display device in the present invention is to switch a surface between a plane and a curve at will.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED

For better understanding embodiments of the present invention, the following detailed description taken in conjunction with the accompanying drawings is provided. Apparently, the accompanying drawings are merely for some of the embodiments of the present invention. Any ordinarily skilled person in the technical field of the present invention could still obtain other accompanying drawings without use laborious invention based on the present accompanying drawings.

Figure 1:
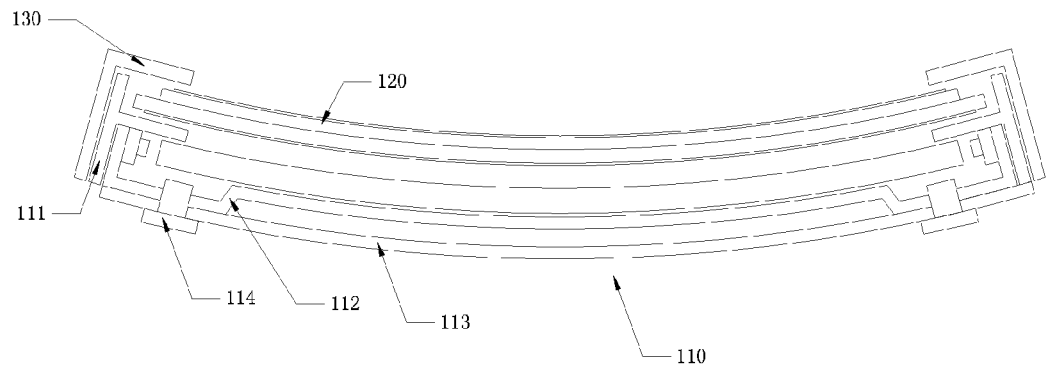
FIG. 1 illustrates a structure diagram of a conventional curved LCD device.
Figure 2:
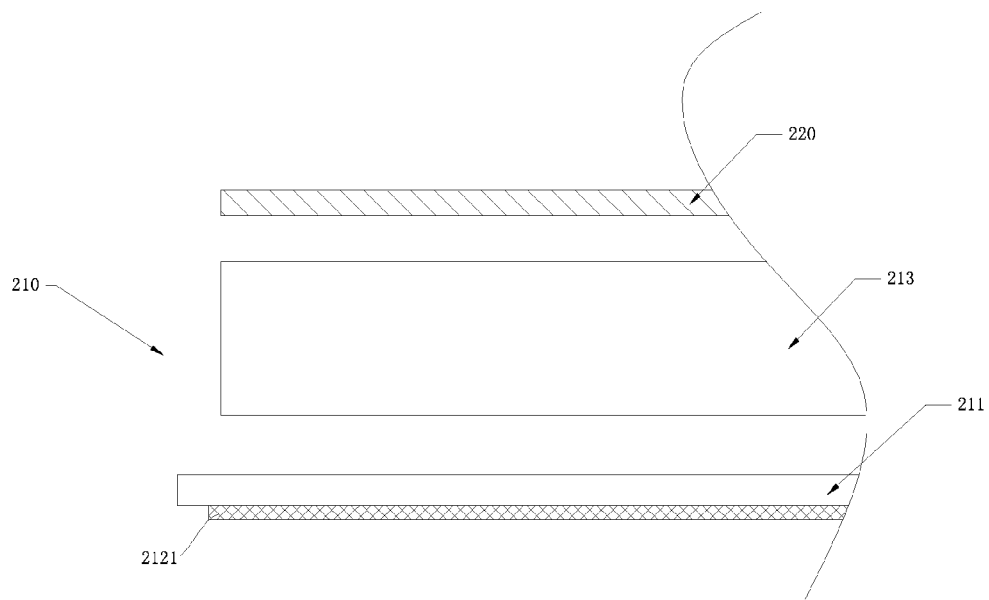
FIG. 2 is a side view diagram of an LCD device according to a preferred embodiment of the present invention.

FIG. 2 is a side view diagram of an LCD device according to a preferred embodiment of the present invention.

As FIG. 2 shows, the LCD device of the embodiment according to the present invention comprises a backlight module 210, a liquid crystal display panel 220 and a frame (not shown).

The liquid crystal display panel 220 is above the backlight module 210, and the frame 230 is set up above the liquid crystal display panel 220 and fixed to the backlight module 210 for fixing the liquid crystal display panel 220 above the backlight module 210 to form a display device. The backlight module 210 provides a display light source for the liquid crystal display panel 220 displaying images.

The backlight module 210 comprises a back bezel 211, a heating apparatus, a light guide plate 213 above the back bezel 211, optical films (not shown) and other components.

In the embodiment, the back bezel 211 is made of memorizing alloy materials, such as nickel-titanium memory alloy. In addition, the memorizing alloy is able to be memory metal with the two-way memory effect or the whole memory effect. Memory alloy materials memorize shapes in high or low temperature phase and restore to the original shape in high or low temperature phase when heating or cooling. In the embodiment, it curves the back bezel 211 made of the memorizing alloy material when the temperature is equal or hotter than a predetermined temperature (like a shape transformation temperature of nickel-titanium memory alloy, which is the predetermined temperature, is about 40° C.) and flattens the back bezel 211 made of the memorizing alloy material when the temperature is cooler than a predetermined temperature.

The heating apparatus is a heating sheet 2121 with characters such as slimness, fast heating, transforming shapes with curved surface of a heated object, and transmitting quantity of heat evenly to all contacted parts of the heated object. For instance, the heating sheet 2121 is silica gel flexible heating sheet or others. The heating sheet 2121 is attached onto the lower surface of the back bezel 211 and used for heating the back bezel 211. For example, when a user uses an LCD device, the heating sheet 2121 heats the back bezel 211, the whole back bezel 211 is curved upward (i.e. the whole back bezel 211 is curved to the liquid crystal display panel 220), in the meantime, other components of the backlight module 210 9like LGP 213, etc) and the liquid crystal display panel 220 are curved upward to form a curved LCD device after the back bezel 211 is heated over the predetermined temperature. On the contrary, when the user turns the LCD device off, the heating sheet 2121 stops heating the back bezel 211, and the shape of the back bezel 211 returns to flatness in the low temperature phase to form a plane LCD device when the back bezel 211 is cooled under the predetermined temperature. Therefore, it changes the shape of the LCD device between a plane and a curve at will. Furthermore, it saves packaging cost by packaging plane LCDs without additionally packaging curved LCDs in transportation.

In another embodiment, the heating sheet 2121 is also attached onto the upper surface of the back bezel 211 to curve the whole back bezel 211 upward.

Figure 3:
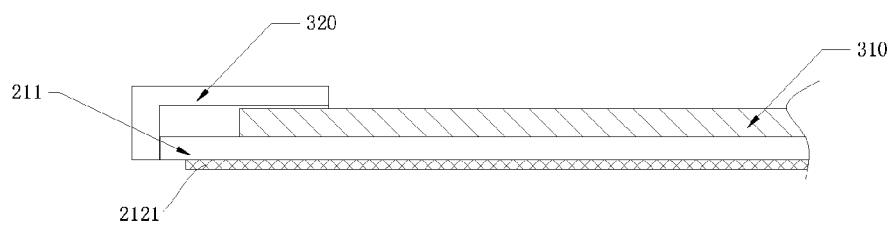
FIG. 3 is a side view diagram of the OLED display device according to another preferred embodiment of the present invention.

FIG. 3 is a side view diagram of the OLED display device according to another preferred embodiment of the present invention.

As FIG. 3 shows, the OLED display device of the embodiment according to the present invention comprises the back bezel 211, an OLED display panel 310 and a frame 320.

The OLED display panel 310 is set up above the back bezel 211, and the frame 320 is set up above the OLED display panel 310 and fixed to the back bezel 211 for fixing the OLED display panel 310 above the back bezel 211 to form an OLED display device.

In the embodiment, the back bezel 211 is made of memorizing alloy materials, such as nickel-titanium memory alloy. In addition, the memorizing alloy is able to be memory metal with the two-way memory effect or the whole memory effect. Memory alloy materials memorize shapes in high or low temperature phase and restore to the original shape in high or low temperature phase when heating or cooling. In the embodiment, it curves the back bezel 211 made of the memorizing alloy material when the temperature is equal or higher than a predetermined temperature (like a shape deformation temperature of nickel-titanium memory alloy, which is the predetermined temperature, is about 40° C.) and flattens the back bezel 211 made of the memorizing alloy material when the temperature is cooler than a predetermined temperature.

The heating apparatus is a heating sheet 2121 with characters such as slimness, fast heating, transforming shapes with curved surface of a heated object, and transmitting quantity of heat evenly to all contacted parts of the heated object. For instance, the heating sheet 2121 is silica gel flexible heating sheet or others. The heating sheet 2121 is attached onto the lower surface of the back bezel 211 and used for heating the back bezel 211. For example, when a user uses an LCD device, the heating sheet 2121 heats the back bezel 211, the whole back bezel 211 is curved upward (i.e. the whole back bezel 211 is curved to the OLED display panel 310), in the meantime, the OLED display panel 310 is curved upward to form a curved OLED display device after the back bezel 211 is heated over the predetermined temperature. On the contrary, when the user turns the OLED display device off, the heating sheet 2121 stops heating the back bezel 211, and the shape of the back bezel 211 returns to flatness in the low temperature phase to form a plane OLED display device when the back bezel 211 is cooled under the predetermined temperature. Therefore, it switches the shape of the OLED display device between a plane and a curve at will. Furthermore, it saves packaging cost by packaging plane OLED display devices without additionally packaging curved OLED display devices in transportation.

Figure 4:
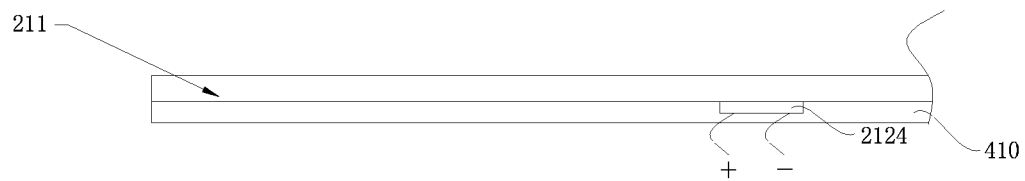
FIG. 4 shows a heating apparatus for heating the back bezel according to another embodiment of the present invention.

FIG. 4 shows a heating apparatus for heating the back bezel according to another embodiment of the present invention.

Referring to FIG. 4, a difference from the heating apparatuses shown in FIG. 2 and FIG. 3 is that the heating apparatus 212 is an electrode 2124 attached onto the lower surface of the back bezel 211. The electrode 2124 is applied by a voltage to heat the back bezel 211. For instance, when the electrode 2124 conducts to heat up the back bezel 211, the whole back bezel 211 in high temperature phase returns to be curved upward to form a curved back bezel after the back bezel is heated over the predetermined temperature. When the electrode 2124 is not applied to the voltage, the back bezel 211 is not heated. The back bezel 211 returns to flatness in the low temperature phase to form a plane back bezel when the back bezel 211 is cooled under the predetermined temperature.

As another embodiment, the electrode 2124 can be attached onto the upper surface of the back bezel 211 and curve the whole back bezel 211 upward.

Furthermore, to enhance safety, it arranges an insulating plate 410 on the lower surface of an active layer 2112 to prevent the back bezel 211 from electric leakage when the power is switched on.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A backlight module comprising:
    a back bezel made of memorizing alloy materials, wherein the back bezel is curved upon a condition that a temperature is equal or over a predetermined temperature, the back bezel is flattened upon a condition that the temperature is under the predetermined temperature, the predetermined temperature indicates to a threshold temperature of deformation of the memorizing alloy materials; and
    a heating apparatus for heating the back bezel,
    wherein the heating apparatus is an electrode, fixed onto the lower or upper surface of the back bezel, for conducting to heat up the back bezel.

2. The backlight module of claim 1, wherein the heating apparatus is a heating sheet, fixed onto a lower or upper surface of the back bezel, for heating the back bezel.

3. The backlight module of claim 1 further comprising an insulating plate fixed onto the lower surface of the back bezel.

4. A liquid crystal display device including a backlight module and a liquid crystal panel over the backlight module, the backlight module comprising:
    a back bezel made of memorizing alloy materials, wherein the back bezel is curved upon a condition that a temperature is equal or over a predetermined temperature, the back bezel is flattened upon a condition that the temperature is under the predetermined temperature, the predetermined temperature indicates to a threshold temperature of deformation of the memorizing alloy materials; and
    a heating apparatus for heating the back bezel,
    wherein the heating apparatus is an electrode, fixed onto the lower or upper surface of the back bezel, for conducting to heat up the back bezel.

5. The liquid crystal display device of claim 4, wherein the heating apparatus is a heating sheet, fixed onto a lower or upper surface of the back bezel, for heating the back bezel.

6. The liquid crystal display device of claim 4 further comprising an insulating plate fixed onto the lower surface of the back bezel.

7. An organic light emitting diode (OLED) display device comprising:
    a back bezel, made of memorizing alloy materials;
    an OLED panel over the back bezel; and
    a heating apparatus for heating the back bezel, wherein a back bezel,
    wherein the back bezel is curved upon a condition that a temperature is equal or over a predetermined temperature, the back bezel is flattened upon a condition that the temperature is under the predetermined temperature, the predetermined temperature indicates to a threshold temperature of deformation of the memorizing alloy materials, and
    wherein the heating apparatus is an electrode, fixed onto the lower or upper surface of the back bezel, for conducting to heat up the back bezel.

8. The OLED display device of claim 7, wherein the heating apparatus is a heating sheet, fixed onto a lower or upper surface of the back bezel, for heating the back bezel.

9. The OLED display device of claim 7 further comprising an insulating plate fixed onto the lower surface of the back bezel.

* * * * *